(12) United States Patent
Seto et al.

(10) Patent No.: US 9,991,410 B2
(45) Date of Patent: Jun. 5, 2018

(54) METHOD AND APPARATUS FOR MANUFACTURING LEAD WIRE FOR SOLAR CELL

(71) Applicant: Neturen Co., LTD., Tokyo (JP)

(72) Inventors: Yoshiki Seto, Tokyo (JP); Kunihiro Kobayashi, Tokyo (JP); Nobumoto Ishiki, Tokyo (JP); Hisaaki Watanabe, Shizuoka (JP)

(73) Assignee: NETUREN CO., LTD., Tokyo (JP)

( * ) Notice: Subject to any disclaimer, the term of this patent is extended or adjusted under 35 U.S.C. 154(b) by 388 days.

(21) Appl. No.: 14/345,629

(22) PCT Filed: Sep. 28, 2012

(86) PCT No.: PCT/JP2012/075877
§ 371 (c)(1),
(2) Date: Mar. 18, 2014

(87) PCT Pub. No.: WO2013/047909
PCT Pub. Date: Apr. 4, 2013

(65) Prior Publication Data
US 2014/0357015 A1  Dec. 4, 2014

(30) Foreign Application Priority Data
Sep. 29, 2011 (JP) .................... 2011-215138

(51) Int. Cl.
*B05C 11/00* (2006.01)
*H01L 31/18* (2006.01)
(Continued)

(52) U.S. Cl.
CPC .............. *H01L 31/18* (2013.01); *B32B 15/01* (2013.01); *C22C 9/00* (2013.01); *C22C 13/00* (2013.01);
(Continued)

(58) Field of Classification Search
None
See application file for complete search history.

(56) References Cited

U.S. PATENT DOCUMENTS 2,320,129 A   6/1939  Harris
2,384,500 A * 9/1945  Stoll ............................ 427/251
(Continued)

FOREIGN PATENT DOCUMENTS

CH   655265 A5 *  4/1986  ............... B23H 7/08
EP   2067560 A1 * 6/2009  ............... B23H 7/08
(Continued)

OTHER PUBLICATIONS

Complete Specification and Drawings of "Method and Apparatus for Continuous Combined Annealing and Coating of Metal Wire" published on November 27, 1968 (1,134,724)
(Continued)

*Primary Examiner* — David E Graybill
(74) *Attorney, Agent, or Firm* — Wenderoth Lind & Ponack, L.L.P.

(57) ABSTRACT

A method of manufacturing a lead wire for a solar cell includes heating a wire material by a direct resistance heating or by an induction heating to reduce a 0.2% proof stress of the wire material while conveying the wire material and plating the wire material that is in a heated condition obtained by the direct resistance heating or by the induction heating while further conveying the wire material. An apparatus is configured to implement the method, and includes a plating bath, a conveyor mechanism configured to convey the wire material, a heater configured to heat the wire material, and a controller configured to control the conveyor mechanism and the heater.

4 Claims, 5 Drawing Sheets

(51) Int. Cl.
  *C23C 2/00* (2006.01)
  *C23C 2/02* (2006.01)
  *C23C 2/38* (2006.01)
  *B32B 15/01* (2006.01)
  *C22C 9/00* (2006.01)
  *C22C 13/00* (2006.01)
  *C23C 18/16* (2006.01)
  *H01B 1/02* (2006.01)

(52) U.S. Cl.
  CPC ............. *C23C 2/003* (2013.01); *C23C 2/02* (2013.01); *C23C 2/38* (2013.01); *C23C 18/1628* (2013.01); *C23C 18/1632* (2013.01); *H01B 1/026* (2013.01)

(56) References Cited

U.S. PATENT DOCUMENTS

| | | | |
|---|---|---|---|
| 3,728,144 A | | 4/1973 | Van Poucke |
| 3,739,132 A | * | 6/1973 | Ellinghausen et al. ......... 219/50 |
| 3,765,857 A | * | 10/1973 | Lecourt ............... 65/91 |
| 3,779,056 A | * | 12/1973 | Padjen et al. ..................... 72/47 |
| 3,842,239 A | * | 10/1974 | Ellinghausen et al. ....... 219/155 |
| 4,053,663 A | * | 10/1977 | Caldwell et al. ............. 427/320 |
| 4,155,816 A | * | 5/1979 | Marencak ..................... 205/140 |
| 4,287,404 A | * | 9/1981 | Conyers et al. ........... 219/69.12 |
| 4,478,892 A | * | 10/1984 | Amberson ..................... 427/320 |
| 5,031,432 A | * | 7/1991 | Loesch et al. ................. 72/11.3 |
| 5,821,500 A | * | 10/1998 | Araki et al. ................. 219/155 |
| 5,966,975 A | * | 10/1999 | Lacourcelle ...................... 72/46 |
| 6,176,994 B1 | * | 1/2001 | Lacourcelle .................. 205/102 |
| 2002/0117489 A1 | * | 8/2002 | Arndt et al. ............... 219/130.5 |
| 2007/0017570 A1 | | 1/2007 | Endo et al. |
| 2009/0229715 A1 | | 9/2009 | Takahashi et al. |
| 2010/0301030 A1 | * | 12/2010 | Zhang et al. ............. 219/130.1 |
| 2011/0163085 A1 | | 7/2011 | Kalmbach et al. |
| 2011/0220196 A1 | | 9/2011 | Nishi et al. |
| 2011/0297658 A1 | * | 12/2011 | Peters et al. .................. 219/162 |
| 2013/0220404 A1 | | 8/2013 | Endo et al. |
| 2014/0216545 A1 | | 8/2014 | Endo et al. |
| 2014/0332124 A1 | | 11/2014 | Takahashi et al. |
| 2014/0357015 A1 | * | 12/2014 | Seto et al. ..................... 438/98 |
| 2016/0079458 A1 | | 3/2016 | Endo et al. |

FOREIGN PATENT DOCUMENTS

| | | | | |
|---|---|---|---|---|
| EP | 2276070 A1 | | 1/2011 | |
| GB | 1134724 | * | 11/1968 | |
| JP | 51075608 A | * | 6/1976 | |
| JP | 56150172 A | * | 11/1981 | .............. C23C 1/00 |
| JP | 60121263 A | * | 6/1985 | |
| JP | 4-293757 | | 10/1992 | |
| JP | 5-33038 | | 2/1993 | |
| JP | 05070850 A | * | 3/1993 | .............. C21D 9/62 |
| JP | 9-003552 | | 1/1997 | |
| JP | 2007-059331 | | 3/2007 | |
| JP | 2009016593 A | | 1/2009 | |
| JP | 2009027096 A | | 2/2009 | |
| JP | 2009280898 A | | 12/2009 | |
| JP | 2010095750 A | | 4/2010 | |
| JP | 2010141050 A | | 6/2010 | |
| JP | 2276070 A1 | | 1/2011 | |
| JP | 2011058051 A | | 3/2011 | |
| JP | 4855534 | | 1/2012 | |
| WO | WO 8607552 A1 | * | 12/1986 | .............. B23H 7/08 |

OTHER PUBLICATIONS

Abstract of JP2009016593 (A), dated Jan. 22, 2009.
Abstract of JP2009027096 (A), dated Feb. 5, 2009.
Abstract of JP200928098 (A), dated Dec. 3, 2009.
Abstract of JP2010095750 (A), dated Apr. 30, 2010.
Abstract of JP2010141050 (A), dated Jun. 24, 2010.
Abstract of JP2011058051 (A), dated Mar. 24, 2011.
PCT Documents and International Search Report, dated May 13, 2013.

* cited by examiner

METHOD AND APPARATUS FOR MANUFACTURING LEAD WIRE FOR SOLAR CELL

TECHNICAL FIELD

The present invention relates to a method of manufacturing a lead wire for a solar cell and an apparatus used for the manufacturing.

BACKGROUND ART

A solar cell module has a plurality of silicon cells interconnected via lead wires. The lead wires are also called as interconnectors, and are formed by solder-plating a flat rectangular wire.

The interconnectors are connected to the silicon cells via the solder plate. However, the interconnectors and the silicon cells differ in thermal expansion coefficient. Therefore, bending stress may be generated in the silicon cell that has a smaller thermal expansion coefficient, due to the influence of heat at the time of soldering. Because of the differences in rigidity and surface area between the interconnector and the solar cell, the interconnector deforms earlier than the solar cell by the heat treatment at the time of soldering. The strain of the interconnector causes warping or breakage of the silicon cell. To address this problem, there is a need for reducing 0.2% proof stress of the interconnector. The 0.2% proof stress is an index of mechanical properties. The smaller the 0.2% proof stress of the interconnector, the more the warping of the silicon cell can be reduced.

Interconnectors are manufactured by flattening a conductor material using a die or a roller, slitting the flattened conductor material to form a thin wire having a rectangular sectional shape, heating the conductor wire, and solder plating the conductor wire.

The heat treatment after the slitting process is an annealing process, and removes the internal strain of the conductor wire that has undergone the flattening process and the slitting process, and softens the structure.

To reduce the 0.2% proof stress of a conductor wire having a flat rectangular sectional shape, an indirect heating is being proposed as a heat treatment method (see, e.g., JP2009-016593A, JP2009-027096A, JP2009-280898A and JP2010-141050A).

As for the solder-plating, a bath containing solder in a heated and molten state, a die disposed near the surface level of the bath, and a turn roll disposed inside the bath to rotate about a horizontal axis may be used (see. e.g., JP2010-095750A and JP2011-058051A).

SUMMARY OF INVENTION

As described above, an indirect heating type of heat treatment is being used to reduce the 0.2% proof stress of a conductor wire having a flat rectangular sectional shape. This is because the indirect heating has been considered to be advantageous as compared with a direct resistance heating, as the indirect heating can apply sufficient thermal energy to the conductor as compared with the direct resistance heating (see, e.g., JP2010-141050A). The direct resistance heating is a heating method in which an electric current is applied directly through a conductor to heat the conductor.

To apply sufficient thermal energy to a conductor serving as a base material of an interconnector, a sufficient amount of time is required for the heating. However, the heating time may be shortened be increasing the heating temperature. For example, JP2010-141050A discloses the heating time of 5 to 60 seconds. However, the disclosure of JP2010-141050A implies that the 0.2% proof stress reducing effect is not satisfactory when the heating time is short, and that the heating time is preferably 30 seconds or more even when the heating temperature is high.

From the viewpoint of process management, it is desirable to shorten a process time, and the same is true for the heat treatment for reducing the 0.2% proof stress of a conductor.

In the solder plating process, it is desirable that all the surfaces of the flat wire material be plated uniformly. Accordingly, the wire material is generally preheated before being dipped in a plating solution. However, providing a heating apparatus in the manufacturing line just for the preheating of the wire material is disadvantageous from the viewpoint of installation cost and running cost.

Accordingly, it is an object of the invention to provide a method and an apparatus for manufacturing a lead wire for a solar cell, by which a 0.2% proof stress reducing process can be performed in a short time and the 0.2% proof stress reducing process also serves as a preheating process for plating.

According to an aspect of the invention, a method of manufacturing a lead wire for a solar cell includes heating a wire material by a direct resistance heating or by an induction heating to reduce a 0.2% proof stress of the wire material while conveying the wire material, and plating the wire material that is in a heated condition obtained by the direct resistance heating or by the induction heating while further conveying the wire material.

A heating temperature during the heating may be higher than a plating temperature during the plating.

The heating to reduce the 0.2% proof stress may be completed within 5 seconds after starting the heating of the wire material.

According to another aspect of the invention, an apparatus for manufacturing a lead wire for a solar cell includes a plating bath configured to contain a molten plating solution, a conveyor mechanism configured to convey a wire material along a conveying path, the conveyor mechanism comprising a turning conveyor roll disposed inside the plating bath, a feeding conveyor roll disposed upstream of the plating bath, and a pulling-up conveyor roll disposed downstream of the plating bath, a heater configured to heat, by a direct resistance heating or by an induction heating, a portion of the wire material that is being conveyed by the conveyor mechanism between the feeding conveyor roll and the turning conveyor roll, and a controller configured to control the conveyor mechanism and the heater. The controller controls a conveying speed of the wire material by the conveyor mechanism and an amount of power supply to the heater such that the wire material is heated to reduce a 0.2% proof stress of the wire material while conveying the wire material and such that the wire material, that is in a heated condition obtained by the direct resistance heating or by the induction heating, is dipped and plated in the plating solution while further conveying the wire material.

The feeding conveyor roll may be configured as a power supply roll, and the heater may include an electrode member disposed in the plating solution, and a power supply wiring having a first end coupled to the feeding conveyor roll and a second end coupled to the electrode member to supply power to the wire material that is being conveyed.

The heater may include a hollow ring transformer disposed between the feeding conveyor roll and the turning conveyor roll, an electrode member disposed in the plating solution, a power supply wiring coupled to the ring transformer to supply power to a primary side of the ring transformer, and a conductive member coupling the feeding conveyor roll configured as a power supply roll and the electrode member to supply power to the wire material such that the wire material inside the hollow ring transformer serves as a secondary side of the ring transformer.

According to one or more aspects of the invention, a wire material is heated by a direct resistance heating or by an induction heating to reduce the 0.2% proof stress of the wire material while conveying the wire material, and the wire material is plated by further conveying the wire material inside a plating solution while maintaining the heated condition. Therefore, a preheating process just for the plating is rendered unnecessary and the 0.2% proof stress is reduced, whereby production efficiency is improved.

DESCRIPTION OF EMBODIMENTS

Hereinafter, embodiments of the invention will be described in detail with reference to the drawings. First to fourth embodiments illustrate examples of a direct resistance heating (also called as a direct electric conduction heating), and a fifth embodiment illustrates an example of an induction heating.

First Embodiment

Figure 1:
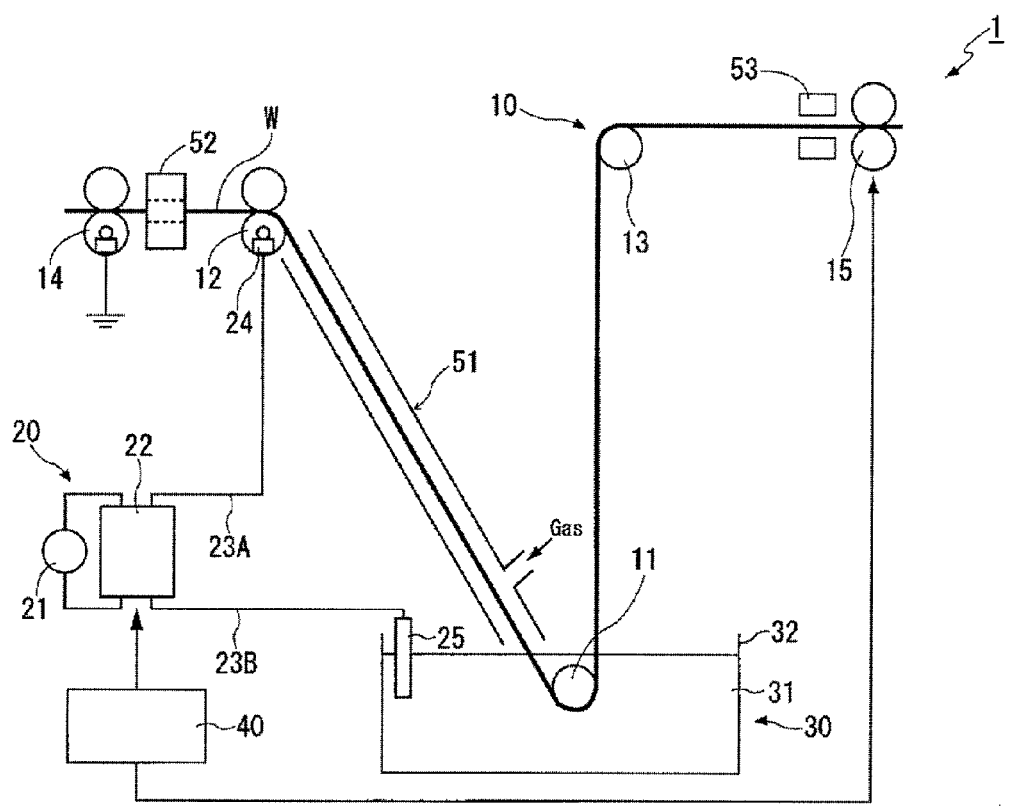
FIG. 1 is a diagram illustrating an apparatus for manufacturing a lead wire for a solar cell according to a first embodiment of the invention.

FIG. 1 is a diagram illustrating an apparatus 1 for manufacturing a lead wire for a solar cell according to a first embodiment of the invention. The apparatus 1 includes a conveyor mechanism 10, a heater 20, a plating section 30, and a controller 40.

The conveyor mechanism 10 includes a plurality of conveyor rolls arranged respective positions along a conveying path of a wire material W. As shown in FIG. 1, a turning conveyor roll 11 is disposed in a plating bath 32, a feeding conveyor roll 12 is disposed upstream of the plating bath 32, and a pulling-up conveyor roll 13 is disposed downstream of the plating bath 32. Further, an introducing conveyor roll 14 is disposed upstream of the feeding conveyor roll 12 and a discharging conveyor roll 15 is disposed downstream of the pulling-up conveyor roll 13. The conveyor mechanism 10 is configured to convey a wire material W made of, for example, a copper material, along the conveying path.

The heater 20 is configured to supply power to a portion of the wire material W that is being conveyed by the conveyor mechanism 10 between the feeding conveyor roll 12 and the turning conveyor roll 11 to heat only the portion of the wire material W that is being conveyed. Joule heat is generated in the wire material W by the electric current, whereby the 0.2% proof stress of the wire material is reduced.

The plating section 30 includes a plating bath 32 containing a plating solution 31 in a molten condition. The turning conveyor roll 11 is disposed inside the plating bath 32 such that the turning conveyor roll 11 is arranged inside the plating solution 31. A heater for heating and melting the plating solution 31 and its associated means are omitted from the drawings. The portion of the wire material W that has been subjected to the 0.2% proof stress reducing process by the power supply from the heater 20 is further conveyed in the heated condition by the conveyor mechanism 10 so as to be dipped into the plating solution 31 for a plating process.

The controller 40 controls the conveying speed of the wire material W by the conveyor mechanism 10 and the amount of power supply output from the heater 20 to a section of the wire material W. The 0.2% proof stress reducing process and the preheating process are simultaneously performed on the wire material W by the controller 40. Accordingly, it is possible improve production efficiency without increasing the size of the apparatus 1 and without separately performing a preheating process before the plating process.

The configuration of the apparatus 1 shown in FIG. 1 will be described in more detail below.

The introducing conveyor roll 14 and the feeding conveyor roll 12 are arranged in this order in the conveying direction at the same height above the plating bath 32. The turning conveyor roll 11 is disposed inside the plating bath 32 so that the wire material W is conveyed through the plating solution 31. The pulling-up conveyor roll 13 is disposed above the plating bath 32 to vertically pull up the wire material W. The discharging conveyor roll 15 is disposed at the same height as the pulling-up conveyor roll 13 to discharge the wire material W from the apparatus 1. The conveyor rolls 11, 12, 13, 14, 15 are arranged to rotate about their respective horizontal axis. Only the turning conveyor roll 11 rotates in the opposite direction from the rotation direction of the other conveyor rolls 12, 13, 14, 15. The conveyor mechanism 10 provides the conveying path including a horizontal introducing path, an inclined path, a pulling-up path, and a horizontal discharging path. A hollow housing 51 is disposed along the inclined path between the feeding conveyor roll 12 and the plating solution 31, and the wire material W is conveyed through the housing 51. Rare gas such as Ar gas or other inert gas is introduced into the housing 51 to prevent the surface oxidation of the wire material W heated by a direct resistance heating. In addition to the inert gas, reducing gas such as $H_2$ gas may be introduced into the housing 51 to reduce the oxidized surface of the wire material W heated by the direct resistance heating.

In the first embodiment, the feeding conveyor roll 12 is configured as a power supply roll. That is, when feeding the wire material W, the feeding conveyor roll 12 is in contact with the wire material W, and the shaft of the feeding conveyor roll 12 is in contact with a sliding element 24. Accordingly, alternate current flows from the contact point between the wire material W and the feeding conveyor roll 12 to the sliding element 24 via the feeding conveyor roll 12.

The heater 20 includes an output controller 22 coupled to a power source 21 to control the output, the sliding element 24 coupled to the output controller 22 via a power supply wiring 23A and electrically coupled to the feeding conveyor roll 12, and an electrode member 25 coupled to the output controller 22 via a power supply wiring 23B and disposed inside the plating bath 32. According to the illustrated example, a portion of the electrode member 25 is disposed inside the plating solution 31 in the plating bath 32. However, the entire electrode member 25 may be disposed inside the plating solution 31. The power source 21 may be a commercial power source or a high-frequency power source. The output controller 22 includes, for example, a transformer having a primary side coupled to the power source 21 and a secondary side coupled to the power supply wirings 23A, 23B.

According to the heater 20 having the configuration described above, the feeding conveyor roll 12 and the plating solution 31 serve as electrodes for a section of the wire material W (hereinafter, "heating section") that is being conveyed between the feeding conveyor roll 12 and the plating solution 31, whereby current flows in the heating section and generates Joule heat in the heating section.

Each part of the wire material W along its longitudinal direction is heated due to the Joule heat generated by the electric current for a period of time during which the part passes through the heating section. Accordingly, the heating time is controlled by the distance along a path from the feeding conveyor roll 12 to the plating solution 31 and the conveying speed of the wire material W. In this embodiment, the controller 40 controls the conveying speed of the wire material W based on the distance between the feeding conveyor roll 12 and the plating solution 31 such that the time required for each part of the wire material W to pass through the heating section is 5 seconds or less.

The Joule heat generated per unit length and per unit time in the heating section of the wire material W is determined by the size and the specific heat of the wire material W in the heating section, and the amount of electric current flowing between the feeding conveyor roll 12 and the plating solution 31. Because the size is determined by the length between the feeding conveyor roll 12 and the plating solution 31 and the sectional size of the wire material W, the size can be set optionally. The amount of electric current is determined by the voltage generated between the sliding element 24 and the plating solution 31. Thus, the amount of electric current can be controlled by controlling one or both of the output current and the output voltage of the output controller 22.

Accordingly, the controller 40 controls the rotation speed of at least one or more of the conveyor rolls 11 to 15 that is closer to the discharging side and controls one or both of the output current and the output voltage of the output controller 22. Through this control, for example, the heating time of the wire material W can be set to 0.5 seconds or less and the temperature of the wire material W when the wire material W reaches the plating solution 31 can be set to be in the range of 650° C. to 1020° C.

Next, a method of manufacturing a lead wire for a solar cell using the apparatus 1 shown in FIG. 1 will be described. A lead wire for a solar cell is formed by providing a solder plating layer on the surfaces of a wire material W. The wire material W is formed of, for example, a copper material, e.g., a high-purity copper with a purity of 99.9999% or more, an oxygen-free copper, a phosphorus deoxidized copper, or a tough pitch copper. The wire material W is formed by forming the material in a flat rectangular wire using a die, a roller or other means, and then by forming the flat rectangular wire to be in a desired width by slitting.

The wire material W is conveyed by the conveyor mechanism 10, and for each part of the wire material W, an electric current is applied for a short period of time after being fed by the feeding conveyor roll 12 until it enters the plating solution 31, during which Joule heat is generated to heat the wire material W. By the time when the wire material W contacts the plating solution 31, the wire material W is heated such that the temperature of the wire material W is in the range of 650° C. to 1020° C. Through this heating process, the 0.2% proof stress of the wire material W is reduced and, at the same time, the preheating for the plating process is performed. When the heating temperature is higher than about 1020° C., the wire material W is melted. The melting point of copper is about 1080° C. When the heating temperature is 650° C., the 0.2% proof stress of a lead wire for a solar cell obtained after the plating process is lowered to 100 MPa or less. It is sufficient that the time during which the electric current is applied to each part of the wire material W be 5 seconds or less. If the electric current is applied for a longer period of time, not only that it becomes difficult to treat the wire material, but also it becomes likely to cause size distortion.

In this manner, the wire material W is heated by a direct resistance heating or by an induction heating under with the heating temperature in the range of 650° C. to 1020° C. and the heating time in a range of 5 seconds or shorter, more particularly, in a range of 0.3 seconds to 5 seconds. When the conditions exceed these ranges, the 0.2% proof stress of the lead wire for a solar cell becomes greater than 100 MPa, which is practically not desirable. When the heating temperature and the heating time of the annealing by the heating exceed these ranges, the elongation rate, an indicator of toughness, is lowered to 25% or less, which is not desirable.

In this way, the wire material W is heated by a direct resistance heating in the heating section between the feeding conveyor roll 12 and the plating solution 31 while being conveyed by the conveyor mechanism 10, whereby the 0.2% proof stress is reduced. The wire material W in this heated condition is dipped in the plating solution 31 in a preheated manner, and then is substantially vertically pulled up by the pulling-up conveyor roll 11. Accordingly, the surfaces of the wire material W, specifically, the top and bottom surfaces and the left and right side surfaces thereof, are plated.

Because the wire material W is substantially vertically pulled up by the pulling-up conveyor roll 13, a plating layer having a symmetric thickness about the axis of the wire material W is formed due to the gravitational force. The plating bath 32 is heated to melt the solder material, and the temperature of the plating solution 31 is lower than the heating temperature by the heater 20. Examples of the plating material include materials such as Pb-containing materials, Pb-free materials, and Su. The plating time is preferably 3 seconds or less from the viewpoint of the apparatus cost, the running cost, and the component maintenance of the plating bath.

According to this manufacturing method, the wire material W is subjected to the 0.2% proof stress reducing process by the direct resistance heating and is then subjected to the plating process in the heated condition. Accordingly, the process only for the preheating is not necessary, thereby improving the production efficiency.

In the apparatus configuration shown in FIG. 1, when the power source 21 is a commercial power source or a high-frequency power source, a choke coil 52 may be disposed between the introducing conveyor roll 14 and the feeding conveyor roll 12 so as to prevent an alternate current from flowing in the introducing conveyor roll 14. When an electric current path is provided at a portion of the wire material W between the feeding conveyor roll 12 connected to the power supply wiring 23A and the plating solution 31, the power source 21 may a direct current power source, and the output current or the output voltage of the output controller 22 may be adjusted by using a variable transformer.

A film thickness meter 53 may be disposed between the pulling-up conveyor roll 13 and the discharging conveyor roll 15 to monitor the thickness of the plating layer of the wire material W, so that the monitored value may be fed back to the controller 40 to control the conveying speed of the wire material W.

Second Embodiment

Figure 2:
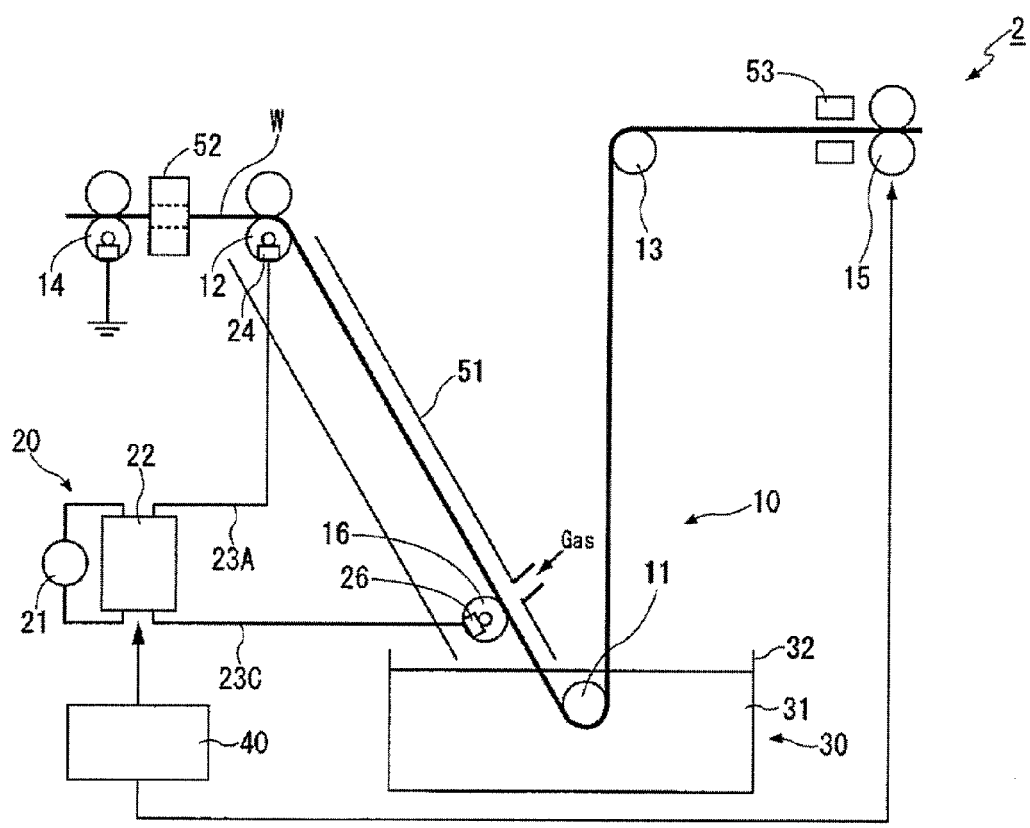
FIG. 2 is a diagram illustrating an apparatus for manufacturing a lead wire for a solar cell according to a second embodiment of the invention.

FIG. 2 is a diagram illustrating an apparatus 2 for manufacturing a lead wire for a solar cell according to a second embodiment of the invention. In FIG. 2, components identical to or corresponding to those in the first embodiment will be referenced by the same reference numerals or signs.

In the second embodiment, unlike the first embodiment, a conveyor roll 16 serving as an electrode is disposed between the feeding conveyor roll 12 and the turning conveyor roll 11 and near the plating bath 32, a sliding element 26 is brought into contact with the conveyor roll 16, and power supply wirings 23A, 23C from the output controller 22 are coupled to the sliding element 26 and the sliding element 24 contacting the feeding conveyor roll 12. Because the sliding element 26 is in sliding contact with the shaft of the conveyor roll 16 like the feeding conveyor roll 12, the portion of the wire material W contacting the conveyor roll 16 can be electrically coupled to the sliding element 26 via the conveyor roll 16.

In the second embodiment, the feeding conveyor roll 12 and the conveyor roll 16 serve as electrodes. Accordingly, the controller 40 can perform the 0.2% proof stress reducing process on the wire material W by controlling the conveying speed of the wire material W and one or both of the alternate current flowing between the electrodes and the voltage in the heating section.

Third Embodiment

Figure 3:
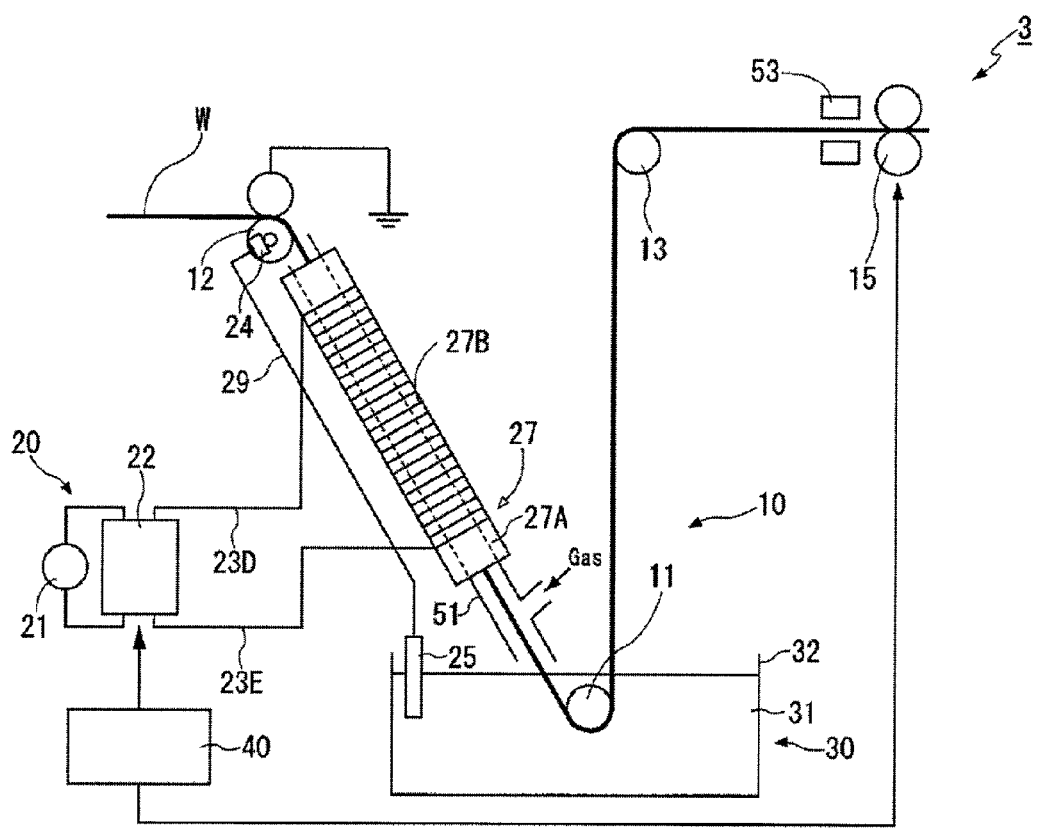
FIG. 3 is a diagram illustrating an apparatus for manufacturing a lead wire for a solar cell according to a third embodiment of the invention.

FIG. 3 is a diagram illustrating an apparatus for manufacturing a lead wire for a solar cell according to a third embodiment of the invention. In FIG. 3, components identical to or corresponding to those in the first embodiment will be referenced by the same reference numerals or signs.

In the third embodiment shown in FIG. 3, unlike the first embodiment, a core 27A of a ring transformer 27 is disposed between the feeding conveyor roll 12 and the turning conveyor roll 11, and a housing 51 is provided inside the hollow ring transformer 27. A wire material W is conveyed inside and through the housing 51. Like the embodiments shown in FIGS. 1 and 2, by introducing inert gas and reducing gas into the housing 51, it is possible to prevent or suppress the oxidation of the heated part of the wire material W.

The sliding element 24 is brought into contact with the feeding conveyor roll 12 disposed upstream of the ring transformer 27, the distal end portion of the electrode member 25 or the entire electrode member 25 is disposed in the plating solution 31, and the sliding element 24 and the electrode member 25 are coupled via a conductive member 29. Power supply wirings 23D, 23E from the output controller 22 are coupled to a primary winding 27B of the ring transformer 27.

According to the configuration shown in FIG. 3, the section of the wire material W inserted through the hollow ring transformer 27 serves as the secondary winding, i.e., the secondary side, of the ring transformer 2, whereby an electromotive force is generated at both ends of the section of the wire material W by the alternating current output from the output controller 22. Therefore, a single circuit is formed by the wire material W and the conductive member 29 via both ends of the section the wire material W, the sliding element 24 and the electrode member 25, electric current flows through the section of the wire material W, and this section serves as the heating section like the first embodiment. This type of direct resistance heating using a ring transformer is also called as an inductive coupled conduction heating.

In the third embodiment, the 0.2% proof stress reducing process can be performed on the wire material W by adjusting the length of the ring transformer 27 and the number of windings of the primary winding 27B and the like, and by controlling the magnitude of the output current from the output controller 22 and the rotation speed of the conveyor rolls by the controller 40.

In the third embodiment, because the ring transformer 27 generates merely a slight voltage between the feeding conveyor roll 12 and the plating solution 31, the choke coil 52 shown in FIG. 1 is not necessary. Accordingly, the apparatus cost is suppressed. An alternate current power source of a commercial frequency to 400 Hz can be used as the power source 20. By increasing the frequency of the power source 20, it is possible to reduce the size of the ring transformer 27.

Fourth Embodiment

Figure 4:
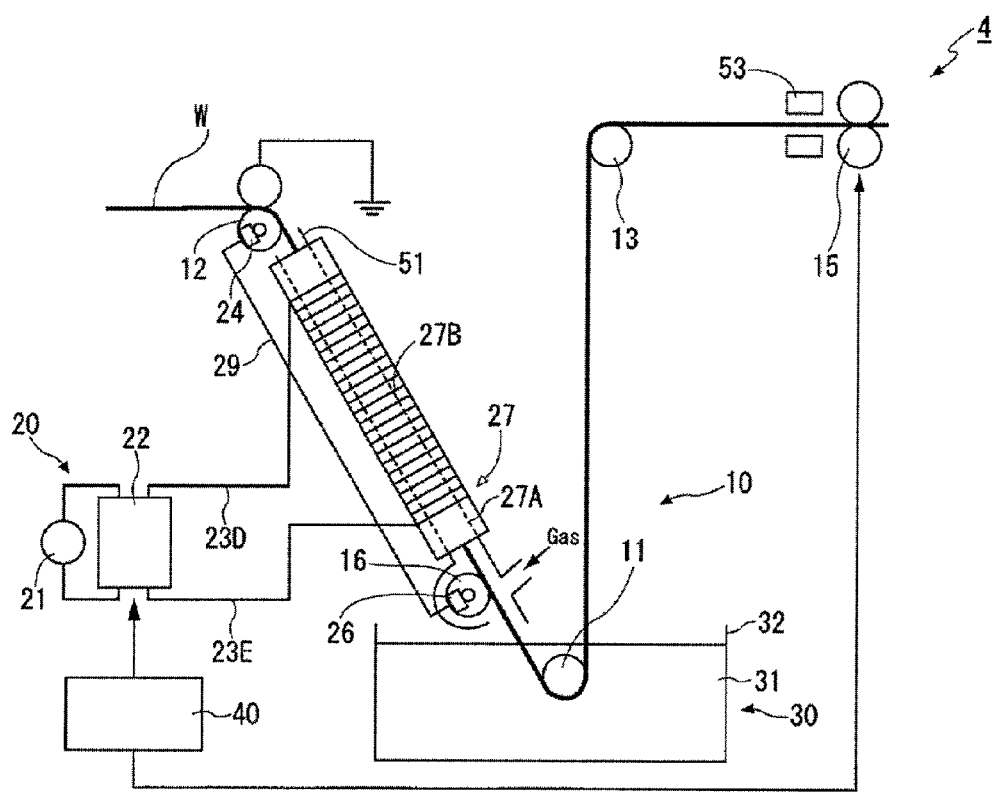
FIG. 4 is a diagram illustrating an apparatus for manufacturing a lead wire for a solar cell according to a fourth embodiment of the invention.

FIG. 4 is a diagram illustrating an apparatus for manufacturing a lead wire for a solar cell according to a fourth embodiment of the invention. In FIG. 4, components identical to or corresponding to those in the third embodiment will be referenced by the same reference numerals or signs.

In the fourth embodiment shown in FIG. 4, unlike the third embodiment, a conveyor roll 16 serving as an electrode is disposed between the feeding conveyor roll 12 and the turning conveyor roll 11 and near the plating bath 32. A core 27A of the ring transformer 27 is disposed between the feeding conveyor roll 12 and the conveyor roll 16, and a wire material W is inserted through the hollow ring transformer 27. Sliding elements 24, 26 are brought into contact with the feeding conveyor roll 12 and the conveyor roll 16 on both sides of the ring transformer 27, and these sliding elements 24, 26 are coupled to each other via a conductive member 29. Power supply wirings 23D, 23E from the output controller 22 are coupled to the primary winding 27B of the ring transformer 27. Because the sliding element 26 is in sliding contact with the shaft of the conveyor roll 16, the portion of the wire material W contacting the conveyor roll 16 is electrically coupled to the sliding element 26 via the conveyor roll 16.

In FIG. 4, the housing 51 is inserted through the hollow core 27A of the ring transformer 27, and the wire material W is inserted through the housing 51. Accordingly, like the example shown in FIG. 3, by introducing inert gas and reducing gas into the housing 51, it is possible to prevent or suppress the oxidation of the heated part of the wire material W.

According to the configuration shown in FIG. 4, the section of the wire material W inserted through the hollow ring transformer 27 serves as the secondary winding of the ring transformer 27, whereby an electromotive force is generated at both ends of the section of the wire material W by the alternating current output from the output controller 22. Therefore, a single circuit is formed by the section of the wire material W and the conductive member 29 via both ends of the section of the wire material W and the sliding elements 24, 26, so that electric current flows in the section of the wire material W, and this section serves as the heating section like the first embodiment. In the fourth embodiment, a commercial power source or a high-frequency power source can be used as the alternate current power source.

In the fourth embodiment, the 0.2% proof stress reducing process can be performed on the wire material W by adjusting the length of the ring transformer 27, the number of windings of the primary winding 27B and the like and by controlling the magnitude of the output current from the output controller 22 and the rotation speed of the conveyor rolls by the controller 40.

Fifth Embodiment

Figure 5:
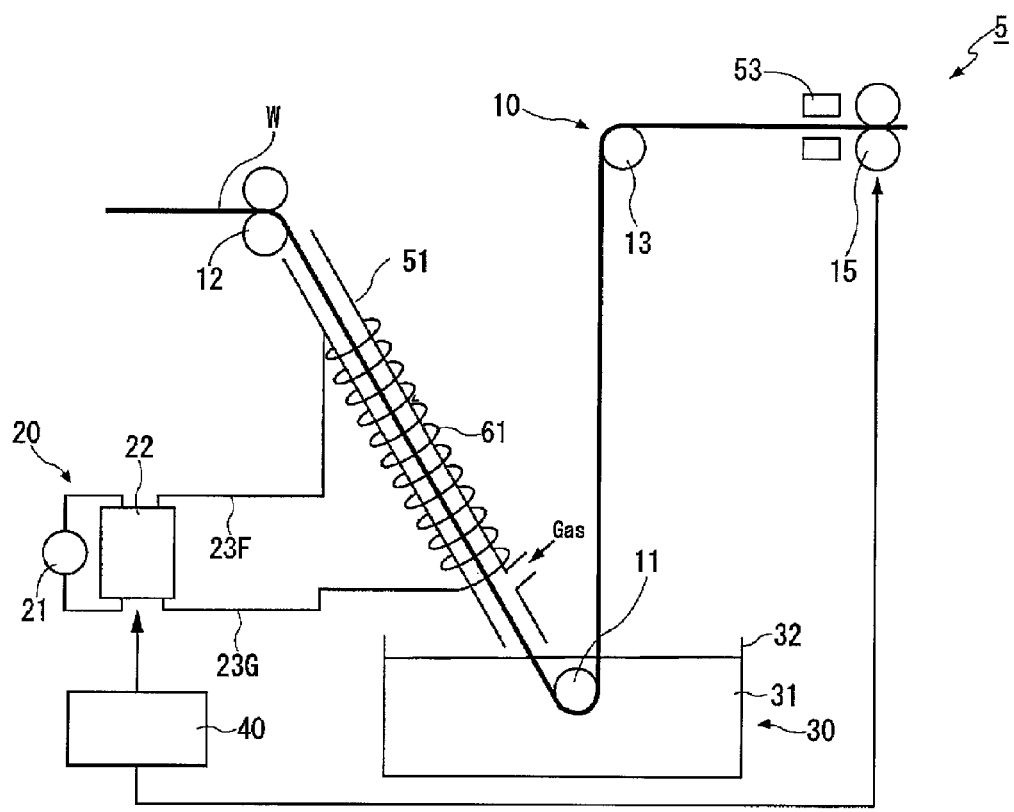
FIG. 5 is a diagram illustrating an apparatus for manufacturing a lead wire for a solar cell according to a fifth embodiment of the invention.

FIG. 5 is a diagram illustrating an apparatus for manufacturing a lead wire for a solar cell according to a fifth embodiment of the invention.

In the manufacturing apparatus 5 shown in FIG. 5, unlike the example shown in FIG. 1, the sliding element 24 is not provided at the feeding conveyor roll 12, the electrode member 25 in the plating solution 31 is not used, and a heating coil 61 is wound on the housing 51. The power source 21 of the heater 20 is coupled to the heating coil 61 via the output controller 22 and power supply wirings 23F, 23G. Accordingly, by inputting high-frequency power from the power source 21, the wire material W is heated by induction heating by the heating coil 61. Therefore, the 0.2% proof stress reducing process can be performed on the wire material W by adjusting the length of the heating coil 61 and the frequency to be used, and by controlling the output controller 22 to control the current and/or the voltage output from the high-frequency power source 21 and controlling the rotation speed of the discharging conveyor roll 15 by the controller 40.

According to the first to fifth embodiments described above, the 0.2% proof stress reducing process is performed on the wire material W that is being conveyed by the conveyor mechanism 10 by heating the wire material W, by a direct resistance heating or an induction heating, using the heater 20, and the wire material W is dipped and plated in the plating solution 31 in the preheated condition. That is, the controller 40 performs the 0.2% proof stress reducing process on the wire material W by controlling the rotation speed of the conveyor roll, the amount of power supply from the heater 20, and the like.

In the first to fifth embodiments, the heating process and the plating process may be performed simultaneously on one or more wire materials W while conveying the one or more wire materials W by the conveyor mechanism.

EXAMPLES

Examples of the 0.2% proof stress reducing process on a wire material W will be described below. The heating process and the plating process were performed in this order by using the manufacturing apparatus 1 shown in FIG. 1. The proof stress and the elongation rate after the annealing by the heating process were measured without providing the plating solution 31 in the plating bath 32 to find the effect of the annealing by the heating process, and for the purpose of comparison with the results after the plating process, the conveyor roll 16 shown in FIG. 2 was used and the distance between the conveyor rolls and the like were adjusted. The used wire material W was made of an oxygen-free copper having a thickness of 0.2 mm and a width of 2 mm in the sectional size thereof. The 0.2% proof stress of the wire material W before the heating process was 250 MPa or more. Sn—Ag—Cu-based Pb-free alloy was used as the plating solution, and the temperature of the plating bath was set to 300° C.

The heating conditions were set as follows.

Examples 1, 2, and 3

Heating Temperature: 650° C.
Heating Time: 0.5 seconds, 3 seconds and 5 seconds, respectively Examples 4, 5, and 6

Heating Temperature: 800° C.
Heating Time: 0.5 seconds, 3 seconds and 5 seconds, respectively Examples 7, 8, and 9

Heating Temperature: 900° C.
Heating Time: 0.3 seconds, 3 seconds and 5 seconds, respectively Examples 10, 11, and 12

Heating Temperature: 1000° C.
Heating Time: 0.3 seconds, 3 seconds, and 5 seconds, respectively Examples 13, 14, and 15

Heating Temperature: 1020° C.
Heating Time: 0.3 seconds, 3 seconds and 5 seconds, respectively Comparative Examples 1, 2, and 3

Heating Temperature: 600° C.
Heating Time: 5 seconds, 3 seconds and 0.5 seconds, respectively Comparative Example 4

Heating Temperature: 1020° C.
Heating Time: 10 seconds

With respect to the wire material after the heating process and the wire material after the heating process and the plating process, the 0.2% proof stresses of were measured based on JIS-Z-2241 and the elongation values of the respective wire materials were measured based on JIS-Z-2201. The results are shown in Table 1.

TABLE 1

| | Heating Temperature (° C.) | Heating Time (sec) | Proof Stress (MPa) | | Rate of Elongation (%) | |
|---|---|---|---|---|---|---|
| | | | Before Plating | After Plating | Before Plating | After Plating |
| Com. Ex. 1 | 600 | 5 | 85 | 105 | 38 | 37 |
| Com. Ex. 2 | 600 | 3 | 90 | 110 | 37 | 36 |
| Com. Ex. 3 | 600 | 0.5 | 95 | 115 | 35 | 34 |
| Ex. 1 | 650 | 5 | 65 | 85 | 35 | 34 |
| Ex. 2 | 650 | 3 | 70 | 90 | 38 | 37 |
| Ex. 3 | 650 | 0.5 | 75 | 95 | 37 | 36 |
| Ex. 4 | 800 | 5 | 55 | 75 | 35 | 34 |
| Ex. 5 | 800 | 3 | 60 | 80 | 36 | 35 |
| Ex. 6 | 800 | 0.5 | 60 | 80 | 36 | 35 |
| Ex. 7 | 900 | 5 | 45 | 65 | 33 | 32 |

TABLE 1-continued

| | Heating Temperature (° C.) | Heating Time (sec) | Proof Stress (MPa) Before Plating | Proof Stress (MPa) After Plating | Rate of Elongation (%) Before Plating | Rate of Elongation (%) After Plating |
|---|---|---|---|---|---|---|
| Ex. 8 | 900 | 3 | 50 | 70 | 34 | 33 |
| Ex. 9 | 900 | 0.3 | 55 | 75 | 35 | 34 |
| Ex. 10 | 1000 | 5 | 35 | 55 | 30 | 29 |
| Ex. 11 | 1000 | 3 | 40 | 60 | 30 | 29 |
| Ex. 12 | 1000 | 0.3 | 42 | 62 | 32 | 31 |
| Com. Ex. 4 | 1020 | 10 | 25 | 45 | 26 | 25 |
| Ex. 13 | 1020 | 5 | 25 | 45 | 28 | 27 |
| Ex. 14 | 1020 | 3 | 26 | 46 | 30 | 29 |
| Ex. 15 | 1020 | 0.3 | 30 | 50 | 28 | 27 |

By performing the heating process, the 0.2% proof stress of the wire material W was lowered to less than 100 MPa from the 250 MPa before the heating process in all of Examples 1 to 15 and Comparative Examples 1 to 4, but the 0.2% proof stress was increased due to the plating process. When the heating temperature was the same, the longer the heating time, the lower the 0.2% proof stress became. When the heating time was the same, the higher the heating temperature, the lower the 0.2% proof stress became.

Therefore, there is a tendency that higher the heating temperature and longer the heating time, the 0.2% proof stress becomes lower. The 0.2% proof stress of the lead wire for a solar cell obtained through the annealing by the heating process and the plating process was less than 100 MPa, when the heating temperature was in the range of 650° C. to 1020° C. and the heating time was 5 seconds or shorter. Further, under these conditions, the elongation rate was greater than 25%.

From Examples 1 to 15, it was found that the heating time that required 30 seconds or more with the conventional indirect heating process can be greatly shortened by the annealing with the heating condition of 650° C. to 1020° C., and that the 0.2% proof stress reducing process was not adversely affected when the heating time was in the range of 0.3 seconds to 5 seconds.

However, with the heating process under the conditions of a high heating temperature and a heating time of more than 5 seconds as in Comparative Example 4, the wire material was deflected and caused deformation. Accordingly, it was difficult to maintain the quality of a wire material and a lead wire for a solar cell.

Next, the effect of the preheating process on the plating process was studied. Using the manufacturing apparatus 1 shown in FIG. 1, a first wire material was heated under the conditions of the heating temperature and the heating time of Example 15 and then was directly subjected to the plating process, and a second wire material was heated under the same conditions but was cooled to the room temperature and then the cooled wire material was dipped and plated in the plating solution and was pulled out. As a result, the plating layer was formed uniformly in a beautiful manner on the surface of the first wire material which was plated directly after the heating. In contrast, the plating layer was not formed uniformly on the second wire material which was cooled to the room temperature after the annealing by the heating process and then was dipped and plated in the plating solution in a non-heated condition. It is considered that, by heating the wire material before plating the wire material in the plating solution, a plating layer can be uniformly formed in a beautiful manner and the bonding strength of the plating layer can be improved. Consequently, it was found that a preheating process provides advantageous results in the plating process.

From the examples described above, it was found that a desirable lead wire for a solar cell can be manufactured by annealing a wire material W through the heating process and by plating the wire material W in the heated condition. Further, according to the embodiments of the invention, it is possible to efficiently reduce the apparatus cost and the running cost.

While the invention has been described with reference to certain embodiments thereof, the scope of the invention is not limited to the embodiments described above, and it will be understood by those skilled in the art that various changes and modifications may be made therein without departing from the scope of the invention as defined by the appended claims.

INDUSTRIAL APPLICABILITY

One or more embodiments of the invention provide a method and an apparatus for manufacturing a lead wire for a solar cell, by which a 0.2% proof stress reducing process can be performed in a short time and the 0.2% proof stress reducing process also serves as a preheating process for plating.

This application is based on Japanese Patent Application No. 2011-215138 filed on Sep. 29, 2011, the entire content of which is incorporated herein by reference.

The invention claimed is:

1. An apparatus for manufacturing a lead wire for a solar cell, the apparatus comprising:
    a plating bath configured to contain a molten plating solution;
    a conveyor mechanism configured to convey a wire material along a conveying path, the conveyor mechanism comprising a turning conveyor roll disposed inside the plating bath, a feeding conveyor roll disposed upstream of the plating bath, and a pulling-up conveyor roll disposed downstream of the plating bath;
    a heater configured to heat, by a direct resistance heating or by an induction heating, a portion of the wire material that is being conveyed by the conveyor mechanism between the feeding conveyor roll and the turning conveyor roll; and
    a controller configured to control the conveyor mechanism and the heater,
    wherein the controller controls a conveying speed of the wire material by the conveyor mechanism and an amount of power supply to the heater such that the wire material is heated to reduce a 0.2% proof stress of the wire material while conveying the wire material and such that the wire material, that is in a heated condition obtained by the direct resistance heating or by the induction heating, is dipped and plated in the plating solution while further conveying the wire material, and
    wherein the plating bath and the heater are arranged such that the wire material is plated directly after being heated by the heater.

2. The apparatus according to claim 1, wherein the feeding conveyor roll is configured as a power supply roll, and wherein the heater comprises:
    an electrode member disposed in the plating solution; and
    a power supply wiring having a first end coupled to the feeding conveyor roll and a second end coupled to the electrode member to supply power to the wire material that is being conveyed.

3. The apparatus according to claim 1, wherein the heater comprises:
- a hollow ring transformer disposed between the feeding conveyor roll and the turning conveyor roll;
- an electrode member disposed in the plating solution;
- a power supply wiring coupled to the ring transformer to supply power to a primary side of the ring transformer; and
- a conductive member coupling the feeding conveyor roll configured as a power supply roll and the electrode member to supply power to the wire material such that the wire material inside the hollow ring transformer serves as a secondary side of the ring transformer.

4. The apparatus according to claim 1, wherein the controller is configured to control the conveying speed of the wire material by the conveyor mechanism and the amount of power supply to the heater such that the wire material is heated to be in a range of 650° C. to 1020° C. when the wire material reaches the plating solution.

* * * * *